US012149196B2

(12) United States Patent
Shahid et al.

(10) Patent No.: US 12,149,196 B2
(45) Date of Patent: Nov. 19, 2024

(54) SYSTEMS AND METHODS FOR IMPROVED FAULT DIAGNOSTICS OF ELECTRICAL MACHINES UNDER DYNAMIC LOAD OSCILLATIONS

(71) Applicant: General Electric Technology GmbH, Baden (CH)

(72) Inventors: Ali Shahid, Bengaluru (IN); Sumitha Mohan, Bengaluru (IN); Rupam Mukherjee, Hyderabad (IN); Arvind Kumar Tiwari, New York, NY (US); Balakrishna Pamulaparthy, Hyderabad (IN)

(73) Assignee: GE Infrastructure Technology LLC, Greenville, SC (US)

( * ) Notice: Subject to any disclaimer, the term of this patent is extended or adjusted under 35 U.S.C. 154(b) by 145 days.

(21) Appl. No.: 17/452,838

(22) Filed: Oct. 29, 2021

(65) Prior Publication Data

US 2023/0139907 A1 May 4, 2023

(51) Int. Cl.
*H02P 29/028* (2016.01)
*G01R 31/34* (2020.01)

(52) U.S. Cl.
CPC .......... *H02P 29/028* (2013.01); *G01R 31/343* (2013.01)

(58) Field of Classification Search
CPC ..... H02P 29/028; G01R 31/343; G01R 19/06; G01R 21/1271; G01R 21/1331; G01R 21/001; G01R 11/54
See application file for complete search history.

(56) References Cited

U.S. PATENT DOCUMENTS

| 8,405,339 | B2 | 3/2013 | Zhang | |
|---|---|---|---|---|
| 8,473,228 | B2* | 6/2013 | Tiwari | H02P 29/0241 702/58 |
| 9,151,802 | B2 | 10/2015 | Donolo | |
| 2012/0109546 | A1 | 5/2012 | Tiwari | |
| 2016/0154065 | A1* | 6/2016 | Nadarajan | G01R 29/16 702/58 |
| 2020/0341063 | A1* | 10/2020 | Bickel | G01R 27/16 |

FOREIGN PATENT DOCUMENTS

| CA | 3056311 A1 * | 9/2018 | .......... E21B 43/128 |
|---|---|---|---|
| CN | 106646224 A  * | 5/2017 | |

OTHER PUBLICATIONS

M'hamed Drif, Active and Reactive Power Spectra-Based Detection and Separation of Rotor Faults and Low-Frequency Load Torque Oscillations, 2017, IEEE, 2702-2709 (Year: 2017).*

C.H. De Angelo, Discriminating broken rotor bar from oscillating load effects using the instantaneous active and reactive powers, 2009, IET, 281-290 (Year: 2009).*

(Continued)

*Primary Examiner* — Bickey Dhakal
(74) *Attorney, Agent, or Firm* — Eversheds Sutherland (US) LLP (57) ABSTRACT

Systems and methods are disclosed for improved fault diagnostics of electrical machines under dynamic load oscillations. The systems and methods may rely on one or more different algorithms for performing such fault diagnostics. One example, algorithm may involve determining a ratio of an instantaneous real power and a reactive power of the motor.

18 Claims, 9 Drawing Sheets

(56) References Cited

OTHER PUBLICATIONS

Extended European Search Report issued in EP Application No. 22202004.2, dated Mar. 6, 2023, 11 pages.

Drif et al., "On-line fault diagnostics in operating three-phase induction motors by the active and reactive power media," 2008 18th International Conference on Electrical Machines, Vilamoura, Portugal, 2008, pp. 1-6, doi: 10.1109/ICELMACH.2008.4800063.

De Angelo et al., "Discriminating broken rotor bar from oscillating load epp. 3ffects using the instantaneous active and reactive powers," IET Electric Power Applications, vol. 4, No. 4, p. 281, XP093027803, ISSN: 1751-8660, DOI: 10.1049/iet-epa. 2009.0101.

Bossio et al., "Separating Broken Rotor Bars and Load Oscillations on IM Fault Diagnosis Through the Instantaneous Active and Reactive Currents," in IEEE Transactions on Industrial Electronics, vol. 56, No. 11, pp. 4571-4580, Nov. 2009, doi: 10.1109/TIE.2009.2024656.

Drif et al., "Discriminating rotor cage faults and mechanical load oscillations in three-phase induction motors by the stator instantaneous complex apparent impedance," 2012 IEEE Energy Conversion Congress and Exposition (ECCE), Raleigh, NC, USA, 2012, pp. 3024-3031, doi: 10.1109/ECCE.2012.6342516.

Cruz, "An Active-Reactive Power Method for the Diagnosis of Rotor Faults in Three-Phase Induction Motors Operating Under Time-Varying Load Conditions," in IEEE Transactions on Energy Conversion, vol. 27, No. 1, pp. 71-84, Mar. 2012, doi: 10.1109/TEC.2011.2178027.

* cited by examiner

SYSTEMS AND METHODS FOR IMPROVED FAULT DIAGNOSTICS OF ELECTRICAL MACHINES UNDER DYNAMIC LOAD OSCILLATIONS

FIELD OF DISCLOSURE

The present disclosure is related to power systems, and more particularly to systems and methods for improved fault diagnostics of electrical machines under dynamic load oscillations.

BACKGROUND

Existing electrical signature analysis (ESA)-based broken bar detection, eccentricity detection, and/or bearing failure detection algorithms used in association with motors may fail when there are dynamic load oscillations such as from coal crushers, pumps, compressor loads, etc. that match with the respective fault frequency.

BRIEF DESCRIPTION OF THE DRAWINGS

The detailed description is set forth with reference to the accompanying drawings. The drawings are provided for purposes of illustration only and merely depict example embodiments of the disclosure. The drawings are provided to facilitate understanding of the disclosure and shall not be deemed to limit the breadth, scope, or applicability of the disclosure. In the drawings, the left-most digit(s) of a reference numeral may identify the drawing in which the reference numeral first appears. The use of the same reference numerals indicates similar, but not necessarily the same or identical components. However, different reference numerals may be used to identify similar components as well. Various embodiments may utilize elements or components other than those illustrated in the drawings, and some elements and/or components may not be present in various embodiments. The use of singular terminology to describe a component or element may, depending on the context, encompass a plural number of such components or elements and vice versa.

DETAILED DESCRIPTION

Overview

This disclosure relates to, among other things, systems and methods for improved fault diagnostics of electrical machines under dynamic load oscillations. Particularly, the systems and methods described herein may allow for the detection of broken rotor bar faults in induction machines (or other types of machines) with or without low frequency load oscillation, which may interfere with existing broken rotor bar detection techniques. Although broken rotor bar faults may be specifically mentioned herein, the same systems and methods may also be applicable to other types of motor faults as well, such eccentricity faults and bearing fault, as well as any other types of faults under oscillating load conditions.

Generally, the broken rotor bar faults may be identified by monitoring a ratio of two magnitude features ($Y_{fault}/X_{fault}$) for deviations from a constant baseline value, which may occur when a broken rotor bar fault occurs with or without load oscillations. If a broken rotor bar fault is not occurring, the ratio should remain constant (or within a threshold error range of the constant value). Similarly, the absolute of the difference of two angle features $|X_{fault\_Ang} - Y_{fault\_Ang}|$ may also be monitored for deviations from a constant value, which may occur when a broken bar fault occurs with or without load oscillations. Similar to the ratio, this absolute value of the different should remain constant (or within a threshold error range of the constant value) if the fault does not exist. Certain embodiments of the systems and methods can use a hybrid decision making process that may consider the magnitude of $Y_{fault}$ alone (which may work in systems without load oscillation and may fail in systems with load oscillation), along with the ratio $Y_{fault}/X_{fault}$ and $|X_{fault\_Ang} - Y_{fault\_Ang}|$ when a minimum amplitude criteria of $Y_{fault}$ and/or $X_{fault}$ is met (which, in some cases, may occur in systems with load oscillations only) for reliable fault detection. $X_{fault}$ may refer to energy in a band around the broken rotor bar frequency in the Fourier spectrum of the quantity X. $X_{fault\_Ang}$ may refer to an angle of the vector which results from a vectorial sum of all components in a band around the broken rotor bar frequency in the complex FFT of the quantity X. $Y_{fault}$ and $Y_{fault\_Ang}$ may similarly be derived from the quantity Y. X and Y include, but are not limited, to instantaneous real power, and reactive power, respectively.

Some prior conventional methods may exist that rely on these features, however, these prior conventional methods often rely on the assumption that the absolute values remain in certain range for broken bar and for load oscillation. However, this is not accurate when load oscillation coexists with broken rotor bar faults, and hence may not be useful for many field applications. That is, these prior conventional methods may not consider phase shift between broken rotor bar current component and load oscillation current component. By contrast, the systems and methods described herein may not necessarily rely on a specific amplitude range, but instead may rely on the fact that the ratio and angle difference may remain constant irrespective of the amplitude of load oscillation, and may deviate from the baseline value when the broken rotor bar fault occurs with or without load oscillation (due to varying phase difference between broken bar component and load component of current as load phase keep changing with time).

With the above features in mind, numerous approaches may be employed to identify a fault condition. These approaches may be referred to herein as one or more different "algorithms." A first algorithm may involve determining fault information by calculating a ratio of an energy in fault frequency band of instantaneous real power ($P_{in}$) and a reactive power ($Q_{in}$) of the machine. A second algorithm may involve using voltage space vector oriented dq currents. A third algorithm may involve using rotor flux oriented dq currents. In this, the d-q axis is oriented in the direction of the estimated rotor flux in the machine. Voltage space vector (or current space vector) may be the rotating complex number for the voltage (or current). A fourth algorithm may involve using active parks current vector(s) (APV) and reactive parks current vector(s) (RPV). A fifth algorithm may involve using amplitude and phase demodulated current spectrum. A sixth algorithm may involve instantaneous real and reactive apparent impedance. These approaches may be alternative approaches or one or more of the different approaches may be used in conjunction with one another to serve as additional data points. For example, the results of one approach may be used to validate the results of another approach (and/or more than two approaches may be used to increase confidence in the broken rotor bar fault determination). Additional details about how these different algorithms may be implemented may be provided in association with FIGS. 2-10.

In some cases, the first algorithm may not necessarily involve a direct instantaneous real power and reactive power ratio. Instead, a frequency domain transform of instantaneous real and reactive power may be performed, and the energy in a frequency band corresponding to fault from both frequency domain transforms may be determined. Finally, the ratio may be determined.

In some cases, the current demodulation-based method may be beneficial in that it can be used in systems when voltage signals are not measured. The real and reactive power-based method may be beneficial in that it may involve lower number mathematical operations and may not require any motor circuit parameters.

In some embodiments, machine learning and high dimensional anomaly detection may be used to detect anomaly when frequency spectrum becomes spread out in a random fashion due to load oscillation. Several different types of machine learning approaches for classification may be employed.

A first example machine learning approach may involve the use of regression analyses.) $Y_{fault}$ values are calculated for different operating conditions. $Y_{fault}$ is the total power in the reactive power frequency spectrum in a band around the broken rotor fault frequency. A regression based analysis may be used where a polynomial curve may be fitted to this cluster of $Y_{fault}$ values. The slope of the fitted polynomial for broken rotor case may be different in the two cases with and without load pulsation. Secondly, the slopes are compared to determine whether the slope is on the trajectory with load oscillation or the other one. Thirdly, once it is determined that there is load oscillation, $R^2$ values are compared to examine the of fit of the polynomial curve. Lower $R^2$ values may indicate presence of broken rotor. Larger spread in the direction of the slope may indicate a larger load oscillation.

A second example machine learning approach may include statistical distance and high dimensional anomaly detection. This second approach may involve comparing the difference between the distributions of the calculated features without computing geometric features of the clusters. The following operations may be employed. First, calculate either of the following statistical distance metrics to test how different the test distribution is form the baseline distribution. Kullbeck-Liebler divergence, Mahalanobis Distance, Bhattacharya Distance, etc. Second, compute the probability of the test cluster and baseline cluster being sampled from the same distribution, using the divergence/distance metrics. Lower probability values may indicate a potential anomaly. Third, use nearest neighbor distances to calculate overlap between test cluster and baseline cluster. Clusters themselves may be high dimensional in nature consisting of multiple frequency features extracted from current, voltage, real and reactive power and/or any combination of these, which capture load oscillation as well as operating condition parameters to capture variations in load and supply conditions. In addition to frequency features and operating condition parameters, we also consider specific physics-based features for each fault under investigation. An example would be $X_{fault}$, $Y_{fault}$ and their angles $X_{fault\_Ang}$, $Y_{fault\_Ang}$ for broken rotor. Similarly, for bearing and eccentricity faults, there may be specific regions in the frequency spectrum which may be related to the geometry of the motor/bearing and may be considered as a physics-based feature.

A third example machine learning approach may include neural networks. This third approach may directly compute probability using a trained network. The following operations may be employed. First, train an ANN-based classifier using reference data from lab/field tests. Second, use the trained network to estimate the probability of the test point belonging to the baseline class. Third, lower probability values may indicate a potential anomaly.

Figure 1:
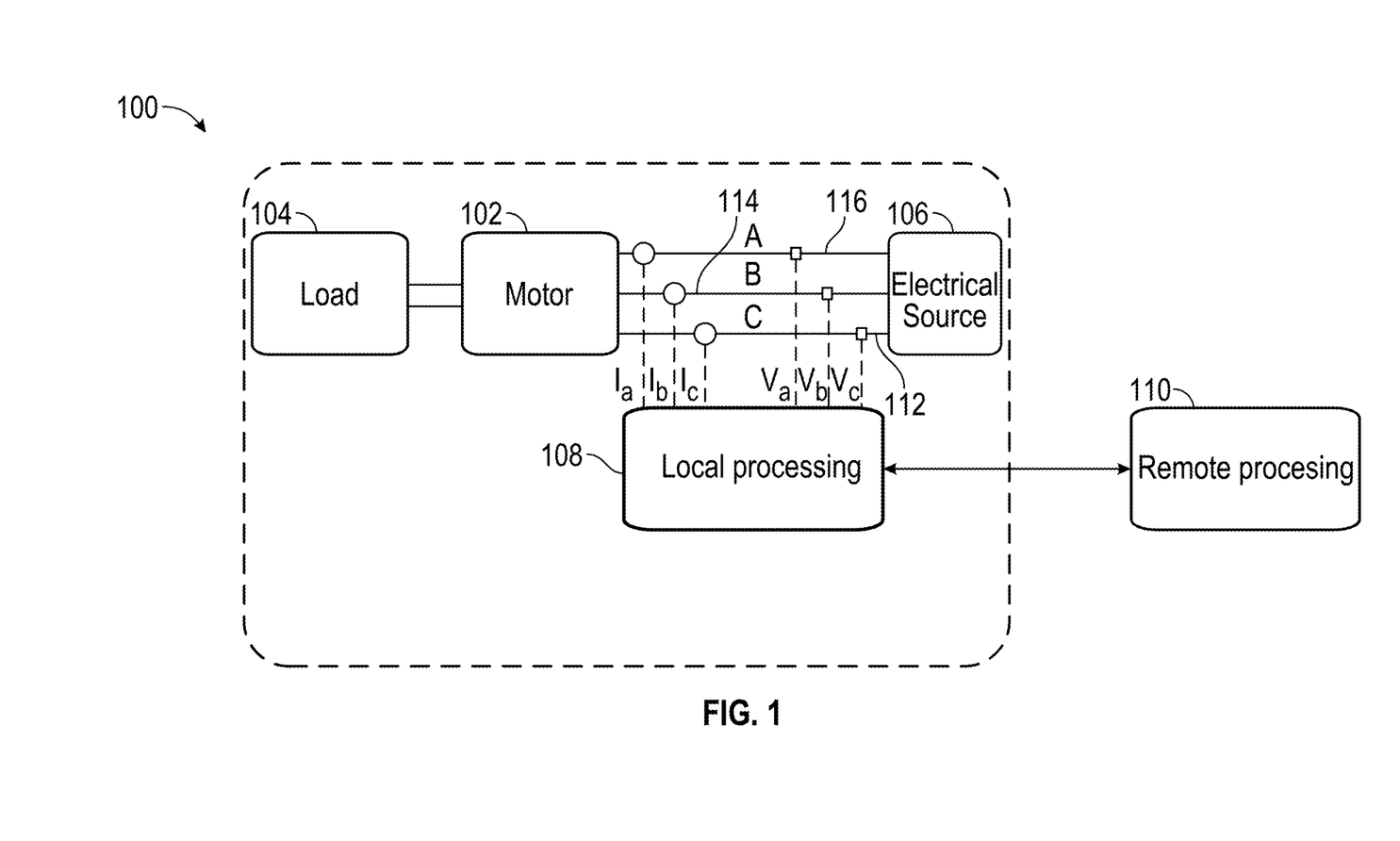
FIG. 1 depicts a schematic diagram of an example system, in accordance with one or more example embodiments of the disclosure.

Turning to the figures, FIG. 1 depicts a schematic diagram of an example system 100, in accordance with one or more example embodiments of the disclosure. In some embodiments, the system 100 may include a motor 102 associated with one or more loads 104 and one or more electrical sources 106. The system 100 may also include a local processing device 108 and/or a remote processing device 110. In some cases, the local processing device 108 and/or remote processing device 110 may include an IED, relay, controller, or any other device associated with processing logic. For example, the local processing device 108 and/or the remote processing device 110 may include at least one or more processors, memory, and one or more analysis modules. The local processing device 108 and/or the remote processing device 110 may similarly include any other elements described in FIG. 11 as well. The one or more analysis modules may be configured to perform any of the operations described herein, such as any operations associated with monitoring and diagnosis of fault conditions in power system (for example, methods and/or operations described with respect to FIGS. 2-10, as well as any other methods and/or operations described herein).

Figure 2:
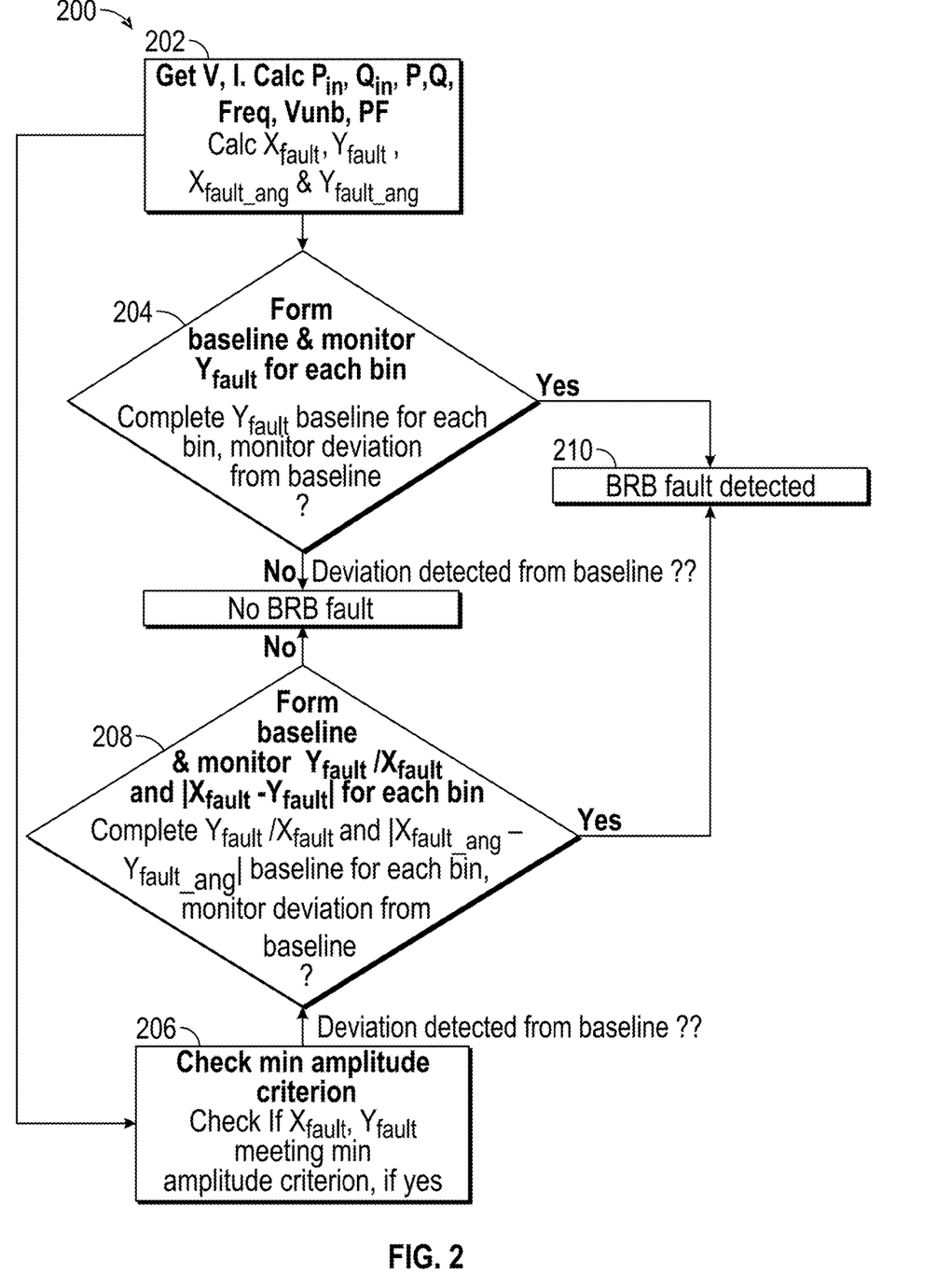
FIG. 2 depicts an example flowchart, in accordance with one or more example embodiments of the disclosure.

FIG. 2 depicts an example flowchart 200, in accordance with one or more example embodiments of the disclosure. The flowchart 200 may illustrate operations involving in association with the first algorithm as described above. The flowchart 200 may begin with operation 202, which may involve obtaining data and performing calculations based on that data. For example, the data that is obtained may include voltage and/or current data from the motor. However, the data may include any other types of data as well. The calculations may involve calculating at least instantaneous real power ($P_{in}$) and reactive power ($Q_{in}$) $P_{inavg}$, $Q_{inavg}$, frequency, $V_{unb}$, a power factor (PF), $X_{fault}$, $X_{fault\_Ang}$, $Y_{fault}$ and $Y_{fault\_Ang}$. $X_{fault}$ may refer to energy in a band around the broken rotor bar frequency in the fourier spectrum of the quantity X. $X_{fault\_Ang}$ may refer to an angle of the vector which results from a vectorial sum of all components in a band around the broken rotor bar frequency in the complex FFT of the quantity X. $Y_{fault}$ and $Y_{fault\_Ang}$ may similarly be derived from the quantity Y. X and Y include, but are not limited to, instantaneous real power, and reactive power, respectively.

Once these calculations are performed in operation 202, the flowchart 200 may proceed to operation 204 and/or operation 206. Operations 204 and 206 may represent different approaches for monitoring for a broken rotor bar fault. For example, Operation 204 may be associated with prior methods as described above. That is, operation 204 may involve monitoring the $Y_{fault}$ on its own for deviations from a baseline value. If a deviation that is a threshold amount away from the baseline is detected, then a broken rotor bar fault may be identified (as shown in operation 210). If a deviation that is a threshold amount away from the baseline is not detected, then it may be determined that a broken rotor bar fault does not exist (as shown in operation 212).

Operations 206 and 208 may be associated with the systems and methods described herein that may involve monitoring the ratio ($Y_{fault}/X_{fault}$) and the angle ($|X_{fault\_Ang} - Y_{fault\_Ang}|$) instead of just the amplitude of $Y_{fault}$. That is, Operation 208 may involve establishing a baseline level and monitoring $Y_{fault}/X_{fault}$ and $|X_{fault\_Ang} - Y_{fault\_Ang}|$ values. Additionally, operation 206 may involve performing a data filtering process to avoid processing noise data in operation 208. That is, a minimum amplitude criterion may be used as the filter in operation 206. However, any other criterion may be used as well. Similar to operation 204, if a deviation that is a threshold amount away from the baseline is detected, then a broken rotor bar fault may be identified (as shown in operation 210). If a deviation that is a threshold amount away from the baseline is not detected, then it may be determined that a broken rotor bar fault does not exist (as shown in operation 212).

Figure 3:
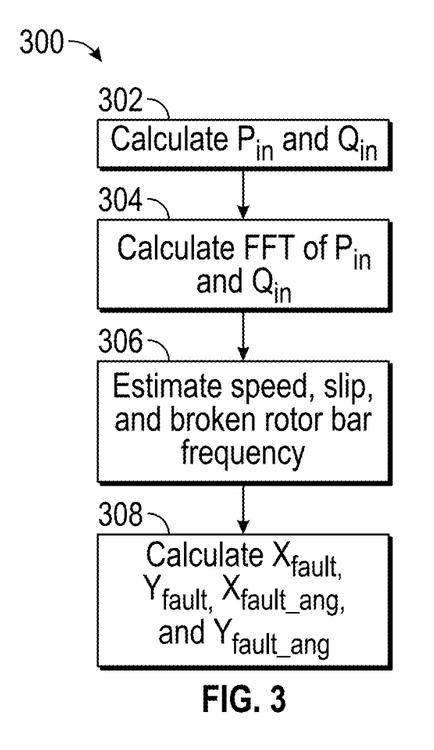
FIG. 3 depicts an example flowchart, in accordance with one or more example embodiments of the disclosure.

FIG. 3 depicts an example flowchart 300, in accordance with one or more example embodiments of the disclosure. The flowchart 300 may illustrate additional operations involved in association with the first algorithm as described above. Operation 302 may involve calculating $P_{in}$ and $Q_{in}$ for the motor. Reactive power may represent electrical energy stored that is stored and flows back to the system. Real power may be the power actually consumed due to a load. In some cases, the instantaneous real power and reactive power data may be time domain data. The instantaneous real power and reactive power may be determined using the voltage and current data associated with the motor. For example, the instantaneous real power and reactive power may be determined using Equations 1 and 2 presented below.

$$P_{in} = V_a * I_a + V_b * I_b + V_c * I_c \quad \text{(Equation 1)}$$

$$Q_{in} = \sqrt{3} * (V_a * I_b - V_b * I_a) \quad \text{(Equation 2)}$$

where $V_a$ and $I_a$ may represent voltage and current data for a first phase of the motor, respectively, $V_b$ and $I_b$ may represent voltage and current data for a second phase of the motor, respectively, and $V_c$ and $I_c$ may represent voltage and current data for a third phase of the motor, respectively.

Operation 304 may involve performing a frequency domain transformation of the determined instantaneous real power and reactive power. For example, the frequency domain transformation may involve performing a Fast Fourier Transform (FFT) of the time domain instantaneous real power and reactive power. However, the frequency domain transformation may be performed using any suitable method.

Operation 306 may involve estimating a speed of the motor, a slip of the motor, and/or a broken rotor bar frequency of the motor. In some cases, the speed of the motor, the slip of the motor, and/or the broken rotor bar frequency of the motor may be determined using Equations 3-5 presented below.

$$f_{slip} = \left(\frac{P}{2}\right) * \left(\frac{P_{in\_avg}}{P_{in\_rated}}\right) * f_{slip\_rated} \quad \text{(Equation 3)}$$

$$f_{rot} = \frac{f_{fund}}{\frac{P}{2}} - \left(\frac{P_{in\_avg}}{P_{in\_rated}}\right) * f_{slip\_rated} \quad \text{(Equation 4)}$$

$$f_{BRB} = 2 * f_{slip} \quad \text{(Equation 5)}$$

where $$f_{slip\_rated} = \frac{f_{rated}}{\frac{P}{2}} - \frac{rated_{rpm}}{60},$$

$f_{rated}$ may represent the rated fund frequency of the machine, and $rated_{rpm}$ may represent the rpm of the machine at full load when supplied with $f_{rated}$ frequency.

Operation 308 may involve determining $X_{fault}$, $X_{fault\_Ang}$, $Y_{fault}$ and $Y_{fault\_Ang}$. $X_{fault}$ may refer to energy in a band around the broken rotor bar frequency in the Fourier spectrum of the quantity X. $X_{fault\_Ang}$ may refer to an angle of the vector which results from a vectorial sum of all components in a band around the broken rotor bar frequency in the complex FFT of the quantity X. $Y_{fault}$ and $Y_{fault\_Ang}$ may similarly be derived from the quantity Y. X and Y include but are not limited to instantaneous real power, and reactive power, respectively.

Figure 4:
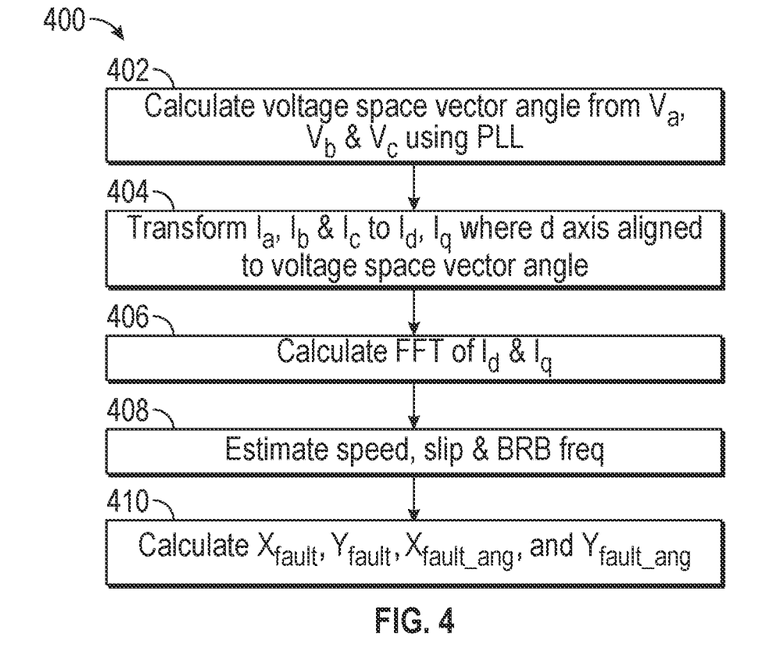
FIG. 4 depicts an example flowchart, in accordance with one or more example embodiments of the disclosure.

FIG. 4 depicts an example flowchart 400, in accordance with one or more example embodiments of the disclosure. The flowchart 400 may illustrate additional operations involved in association with the second algorithm as described above. Operation 402 may involve calculating a voltage space vector angle. In some cases, the voltage space vector angle may be determined based on the voltage data associated with the phases of the motor (for example, $V_a$, $V_b$, and $V_c$) using voltage phase-locked loop (PLL).

Operation 404 may involve transforming current data associated with the phases of the motor (for example, $I_a$, $I_b$, and $I_c$) into $I_d$ and $I_q$. In some case, the d-axis may be aligned to the voltage space vector angle.

This transformation may be performed by converting the three phase currents and voltages into a rotating complex number as follows $\vec{I} = I_d + jI_q = I_a + \alpha I_b + \alpha^2 I_c$ where $$\alpha = e^{j\frac{2\pi}{3}}.$$

The d and q axes may be aligned in any direction. If it is aligned in the direction of the voltage space vector as mentioned above, $I = (I_a + \alpha I_b + \alpha^2 I_c)e^{-j\theta}$ where $\theta$ is the instantaneous angle of the voltage space vector calculated using the PLL.

Operation 406 may involve calculating a frequency domain transform of $I_d$ and $I_q$. For example, the frequency domain transformation may involve performing a Fast Fourier Transform (FFT) of $I_d$ and $I_q$. However, the frequency domain transformation may be performed using any other suitable method.

Operation 408 may involve estimating a speed of the motor, a slip of the motor, and/or a broken rotor bar frequency of the motor. Operation 410 may involve determining $X_{fault}$, $X_{fault\_Ang}$, $Y_{fault}$ and $Y_{fault\_Ang}$. Similar to the first algorithm, the speed of the motor, a slip of the motor, and/or a broken rotor bar frequency of the motor, as well as $X_{fault}$, $X_{fault\_Ang}$, $Y_{fault}$ and $Y_{fault\_Ang}$ may be determined.

Figure 5:
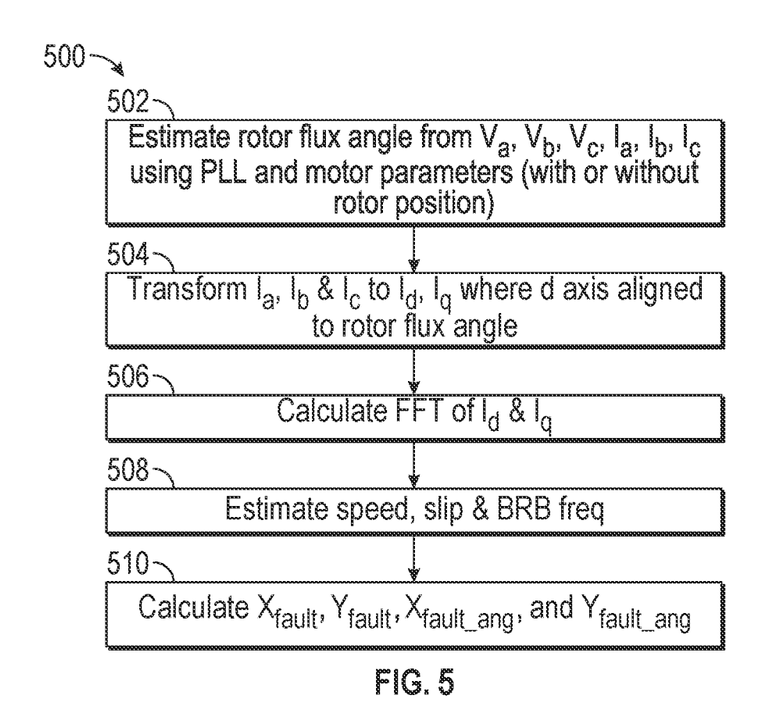
FIG. 5 depicts an example flowchart, in accordance with one or more example embodiments of the disclosure.

FIG. 5 depicts an example flowchart 500, in accordance with one or more example embodiments of the disclosure. The flowchart 500 may illustrate additional operations involved in association with the third algorithm as described above. The third algorithm may be similar to the second algorithm, but may involve using the rotor flux angle instead of the voltage space vector angle. Operation 502 may involve calculating a rotor flux angle. In some cases, the rotor flux angle may be determined based on the voltage and current data associated with the phases of the motor (for example, $V_a$, $V_b$, $V_c$, and $I_a$, $I_b$ and $I_c$) and motor electrical circuit parameters such as inductances and resistances.

Operation 504 may involve transforming current data associated with the phases of the motor (for example, $I_a$, $I_b$, and $I_c$) into $I_d$ and $I_q$. In some case, the d-axis may be aligned to the rotor flux angle.

Operation 506 may involve calculating a frequency domain transform of $I_d$ and $I_g$. For example, the frequency domain transformation may involve performing a Fast Fourier Transform (FFT) of $I_d$ and $I_q$. However, the frequency domain transformation may be performed using any other suitable method.

Operation 508 may involve estimating a speed of the motor, a slip of the motor, and/or a broken rotor bar frequency of the motor. Operation 510 may involve determining $X_{fault}$, $X_{fault\_Ang}$, $Y_{fault}$ and $Y_{fault\_Ang}$. Similar to the first algorithm, the speed of the motor, a slip of the motor, and/or a broken rotor bar frequency of the motor, as well as $X_{fault}$, $X_{fault\_Ang}$, $Y_{fault}$ and $Y_{fault\_Ang}$ may be determined.

Figure 6:
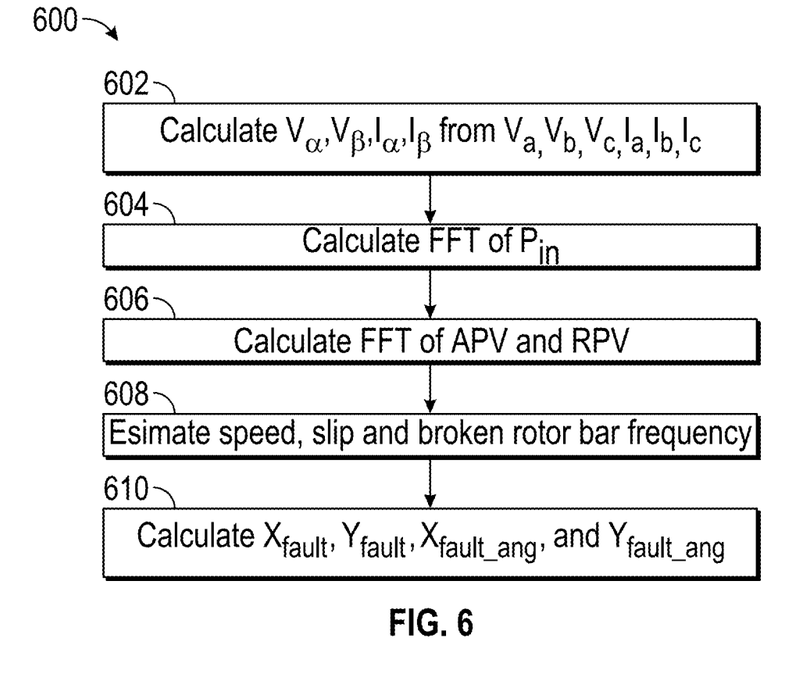
FIG. 6 depicts an example flowchart, in accordance with one or more example embodiments of the disclosure.

FIG. 6 depicts an example flowchart 600, in accordance with one or more example embodiments of the disclosure. The flowchart 600 may illustrate additional operations involved in association with the fourth algorithm as described above. That is, the flowchart 600 may involve determining active parks current vector(s) (APV) and reactive parks current vector(s) (RPV).

Operation 602 may involve calculating $V_\alpha$, $V_\beta$, $I_\alpha$, and $I_\beta$. In some cases, $V_\alpha$, $B_\beta$, $I_\alpha$, and $I_\beta$ may be determined using $V_a$, $V_b$, $V_c$, $I_a$, $I_b$, $I_c$. The α-β quantities may be but dq equivalent quantities in the stationary reference frame. $V_\alpha$ and $V_\beta$ may be the same as $V_d$ and $V_q$ in the stationary reference frame (for example, with a θ value of 0.

Operation 604 may involve determining the APV and RPV. In some cases, these values may be determined using Equations 6-7 presented below. Variables included within these equations may be determined in Equations 8-10, which are also presented below.

$$APV = \sqrt{(I_{\alpha p}^2 + I_{\beta p}^2)} \quad \text{(Equation 6)}$$

$$APV = \sqrt{(I_{\alpha q}^2 + I_{\beta q}^2)} \quad \text{(Equation 7)}$$

where the variables are calculated as below:

$$P_{in} = V_\alpha I_\alpha + V_\beta I_\beta \quad \text{(Equation 8)}$$

$$Q_{in} = V_\beta I_\alpha - V_\alpha I_\beta \quad \text{(Equation 9)}$$

$$I_p = V_\alpha P_{in}/(V_\alpha^2 + V_\beta^2) \quad \text{(Equation 10)}$$

$$I_{\beta P} = V_\beta P_{in}/(V_\alpha^2 + V_\beta^2) \quad \text{(Equation 11)}$$

$$I_{\alpha q} = V_\beta Q_{in}/(V_\alpha^2 + V_\beta^2) \quad \text{(Equation 12)}$$

$$I_{\beta q} = -V_\alpha Q_{in}/(V_\alpha^2 + V_\beta^2) \quad \text{(Equation 13)}.$$

Operation 606 may involve calculating a frequency domain transform of APV and RPV. For example, the frequency domain transformation may involve performing a Fast Fourier Transform (FFT) of APV and RPV. However, the frequency domain transformation may be performed using any other suitable method.

Operation 608 may involve estimating a speed of the motor, a slip of the motor, and/or a broken rotor bar frequency of the motor. These values may also be determined using Equations 3-5 presented above. Operation 610 may involve determining $X_{fault}$, $X_{fault\_Ang}$, $Y_{fault}$ and $Y_{fault\_Ang}$. Similar to the first algorithm, the speed of the motor, a slip of the motor, and/or a broken rotor bar frequency of the motor, as well as $X_{fault}$, $X_{fault\_Ang}$, $Y_{fault}$ and $Y_{fault\_Ang}$ may be determined.

Figure 7:
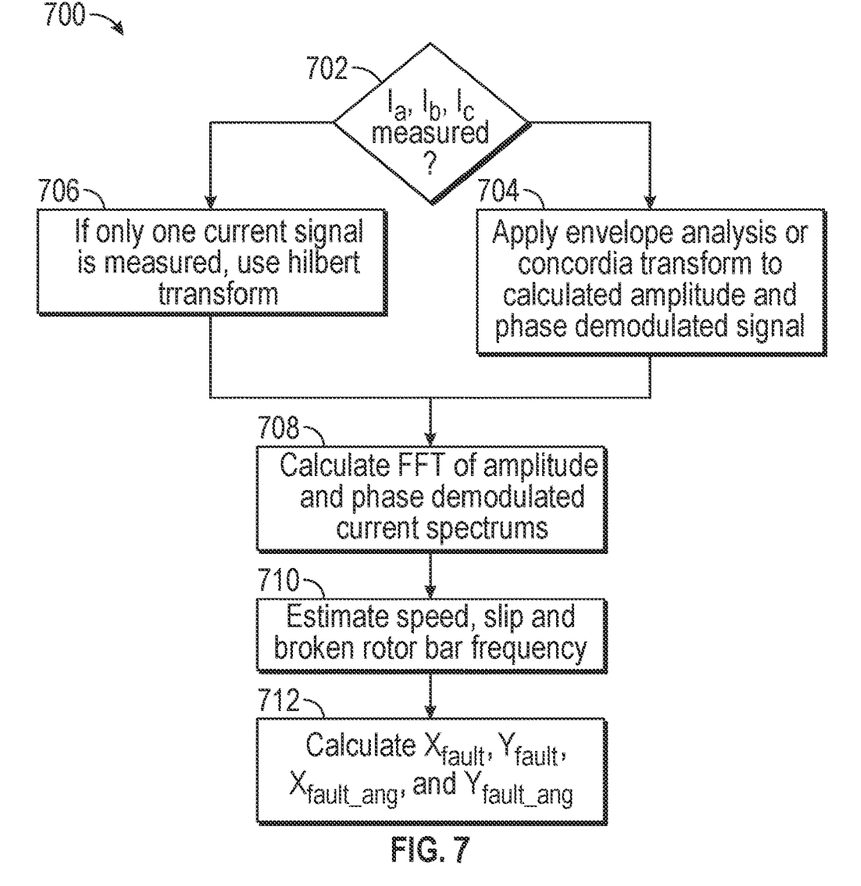
FIG. 7 depicts an example flowchart, in accordance with one or more example embodiments of the disclosure.

FIG. 7 depicts an example flowchart 700, in accordance with one or more example embodiments of the disclosure. The flowchart 700 may illustrate additional operations involved in association with the fifth algorithm as described above. That is, the flowchart 700 may involve using the amplitude and phase demodulated current spectrum.

Operation 702 may involve a determination as to whether current values have been measured for multiple phases of the motor (for example, $I_a$, $I_b$, $I_c$) (This method may be performed if voltages are not measured and only currents are measured, so the conditional check can be if currents are measured, and voltages are not measured). If the current values have been measured, the flowchart 700 may proceed to operation 704. If not, the flowchart 700 may proceed to operation 706. Operation 704 may involve applying envelope analysis or Concordia transform to calculated amplitude and phase demodulated signal. Operation 706 may involve using a Hilbert transform.

Operation 708 may involve calculating a frequency domain transform of amplitude and phase demodulated current spectrums. For example, the frequency domain transformation may involve performing a Fast Fourier Transform (FFT) of amplitude and phase demodulated current spectrums. However, the frequency domain transformation may be performed using any other suitable method.

Operation 710 may involve estimating a speed of the motor, a slip of the motor, and/or a broken rotor bar frequency of the motor. These values may also be determined using Equations 3-5 presented above. Operation 712 may involve determining $X_{fault}$, $X_{fault\_Ang}$, $Y_{fault}$ and $Y_{fault\_Ang}$. Similar to the first algorithm, the speed of the motor, a slip of the motor, and/or a broken rotor bar frequency of the motor, as well as $X_{fault}$, $X_{fault\_Ang}$, $Y_{fault}$ and $Y_{fault\_Ang}$ may be determined.

Figure 8:
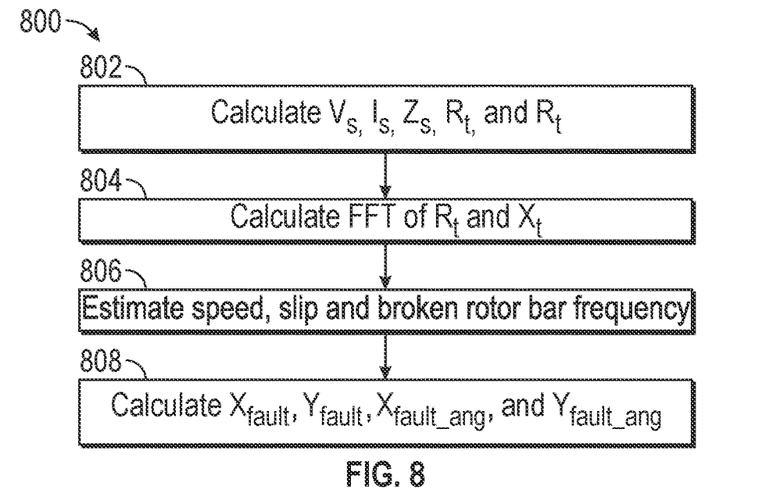
FIG. 8 depicts an example flowchart, in accordance with one or more example embodiments of the disclosure.

FIG. 8 depicts an example flowchart 800, in accordance with one or more example embodiments of the disclosure. The flowchart 800 may illustrate additional operations involved in association with the sixth algorithm as described above.

Operation 802 may involve calculating Vs, Is, Zs, Rt, and Zt. These terms may be calculated, for example, using Equations 14-18 presented below. $V_S$ and $I_S$ may be complex number form of stator voltage and current described above.

$$Vs = Va + Vb\, e^{(j*2pi/3)} + Vc\, e^{(-j*2pi/3)} \quad \text{(Equation 14)}$$

$$Is = Va + Vb\, e^{(j*2pi/3)} + Vc\, e^{(-j*2pi/3)} \quad \text{(Equation 15)}$$

$$Zs = Vs/Is \quad \text{(Equation 16)}$$

$$Rt = \text{Real}(Zs) \quad \text{(Equation 17)}$$

$$Zt = \text{Imaginary}(Zs) \quad \text{(Equation 18)}$$

Operation 806 may involve calculating a frequency domain transform of amplitude and phase demodulated current spectrums. For example, the frequency domain transformation may involve performing a Fast Fourier Transform (FFT) of amplitude and phase demodulated current spectrums. However, the frequency domain transformation may be performed using any other suitable method.

Operation 808 may involve estimating a speed of the motor, a slip of the motor, and/or a broken rotor bar frequency of the motor. These values may also be determined using Equations 3-5 presented above. Operation 810 may involve determining $X_{fault}$, $X_{fault\_Ang}$, $Y_{fault}$ and $Y_{fault\_Ang}$. Similar to the first algorithm, the speed of the motor, a slip of the motor, and/or a broken rotor bar frequency of the motor, as well as $X_{fault}$, $X_{fault\_Ang}$, $Y_{fault}$ and $Y_{fault\_Ang}$ may be determined.

Figure 9A:
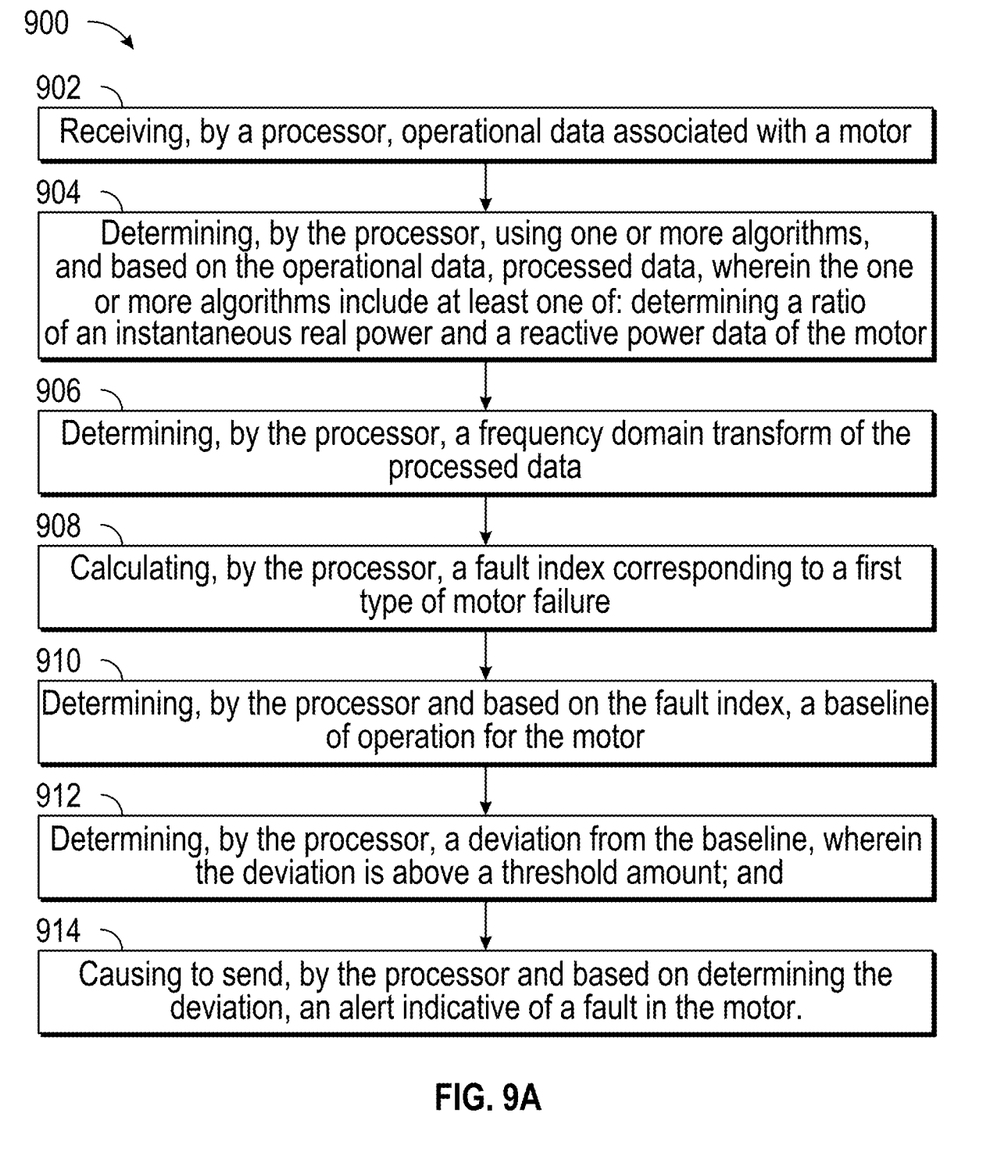
FIGS. 9A-9B are block diagrams of example methods, in accordance with one or more example embodiments of the disclosure.

FIG. 9A is an example process flow diagram of an illustrative method 900. At block 902, the method 900 may include receiving, by a processor, operational data associated with a motor. Block 904 of the method 900 may include determining, by the processor, using one or more algorithms, and based on the operational data, processed data, wherein the one or more algorithms include at least one of: determining a ratio of an instantaneous real power and a reactive power of the motor. Block 906 of the method 900 may include determining, by the processor, a frequency domain transform of the processed data. Block 908 of the method 900 may include calculating, by the processor, a fault index corresponding to a first type of motor failure. Block 910 of the method 900 may include determining, by the processor and based on the fault index, a baseline of operation for the motor. Block 912 of the method 900 may include determining, by the processor, a deviation from the baseline, wherein the deviation is above a threshold amount. Block 914 of the method 900 may include causing to send, by the processor and based on determining the deviation, an alert indicative of a fault in the motor.

Figure 9B:
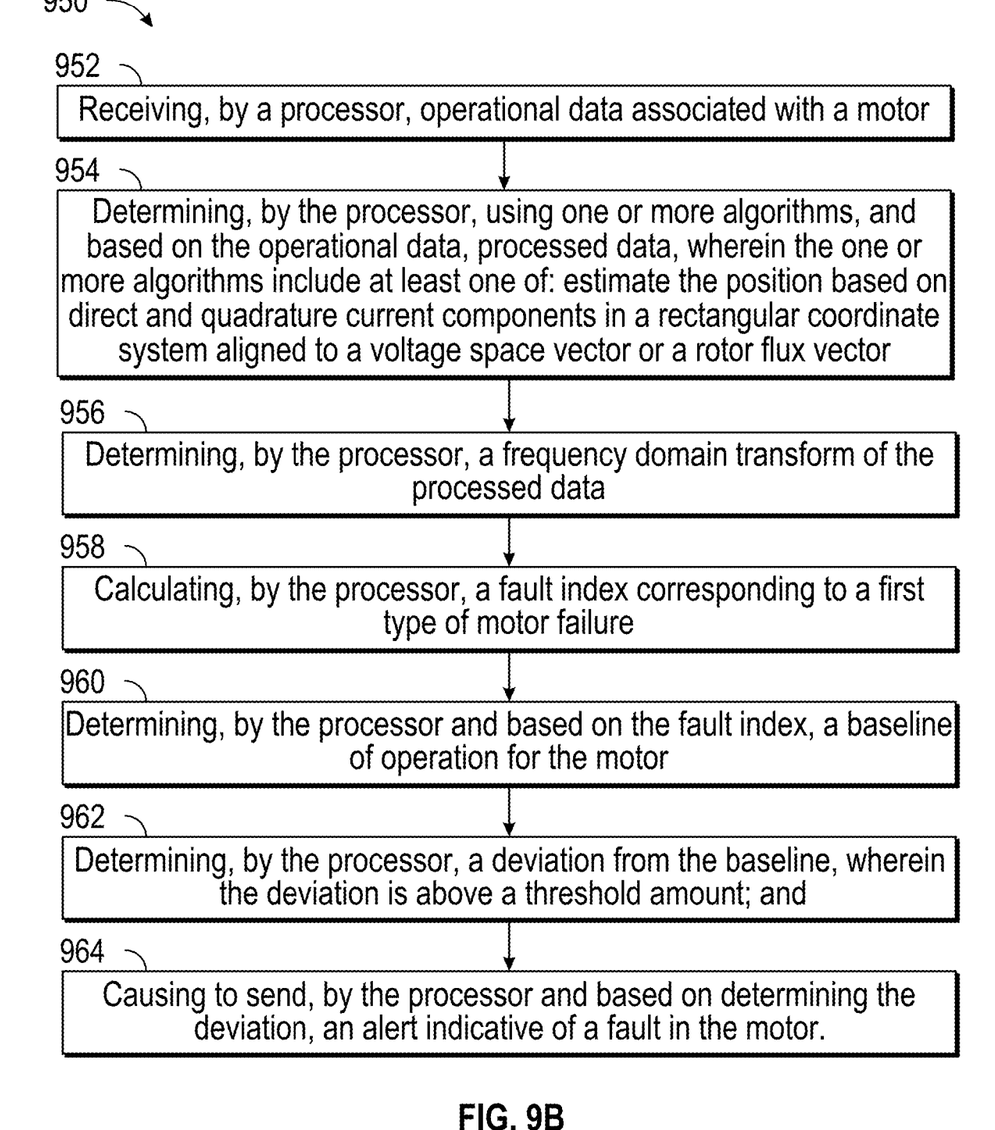

FIG. 9B is an example process flow diagram of an illustrative method 950. At block 952, the method 950 may include receiving, by a processor, operational data associated with a motor. Block 954 of the method 950 may include determining, by the processor, using one or more algorithms, and based on the operational data, processed data, wherein the one or more algorithms include at least one of: estimate the position based on direct and quadrature current components in a rectangular coordinate system aligned to a voltage space vector or a rotor flux vector. Block 956 of the method 950 may include determining, by the processor, a frequency domain transform of the processed data. Block 958 of the method 950 may include calculating, by the processor, a fault index corresponding to a first type of motor failure. Block 960 of the method 950 may include determining, by the processor and based on the fault index, a baseline of operation for the motor. Block 962 of the method 950 may include determining, by the processor, a deviation from the baseline, wherein the deviation is above a threshold amount. Block 964 of the method 950 may include causing to send, by the processor and based on determining the deviation, an alert indicative of a fault in the motor.

The operations described and depicted in the illustrative process flow of FIGS. 9A-9B may be carried out or performed in any suitable order as desired in various example embodiments of the disclosure. Additionally, in certain example embodiments, at least a portion of the operations may be carried out in parallel. Furthermore, in certain example embodiments, less, more, or different operations than those depicted in FIGS. 9A-9B may be performed.

One or more operations of the process flow of FIGS. 9A-9B may have been described above as being performed by a user device, or more specifically, by one or more program modules, applications, or the like executing on a device. It should be appreciated, however, that any of the operations of process flow of FIGS. 9A-9B may be performed, at least in part, in a distributed manner by one or more other devices, or more specifically, by one or more program modules, applications, or the like executing on such devices. In addition, it should be appreciated that processing performed in response to execution of computer-executable instructions provided as part of an application, program module, or the like may be interchangeably described herein as being performed by the application or the program module itself or by a device on which the application, program module, or the like is executing.

Although specific embodiments of the disclosure have been described, one of ordinary skill in the art will recognize that numerous other modifications and alternative embodiments are within the scope of the disclosure. For example, any of the functionality and/or processing capabilities described with respect to a particular device or component may be performed by any other device or component. Further, while various illustrative implementations and architectures have been described in accordance with embodiments of the disclosure, one of ordinary skill in the art will appreciate that numerous other modifications to the illustrative implementations and architectures described herein are also within the scope of this disclosure.

Certain aspects of the disclosure are described above with reference to block and flow diagrams of systems, methods, apparatuses, and/or computer program products according to example embodiments. It will be understood that one or more blocks of the block diagrams and flow diagrams, and combinations of blocks in the block diagrams and the flow diagrams, respectively, may be implemented by execution of computer-executable program instructions. Likewise, some blocks of the block diagrams and flow diagrams may not necessarily need to be performed in the order presented, or may not necessarily need to be performed at all, according to some embodiments. Further, additional components and/or operations beyond those depicted in blocks of the block and/or flow diagrams may be present in certain embodiments.

Accordingly, blocks of the block diagrams and flow diagrams support combinations of means for performing the specified functions, combinations of elements or steps for performing the specified functions, and program instruction means for performing the specified functions. It will also be understood that each block of the block diagrams and flow diagrams, and combinations of blocks in the block diagrams and flow diagrams, may be implemented by special-purpose, hardware-based computer systems that perform the specified functions, elements or steps, or combinations of special-purpose hardware and computer instructions.

Figure 10:
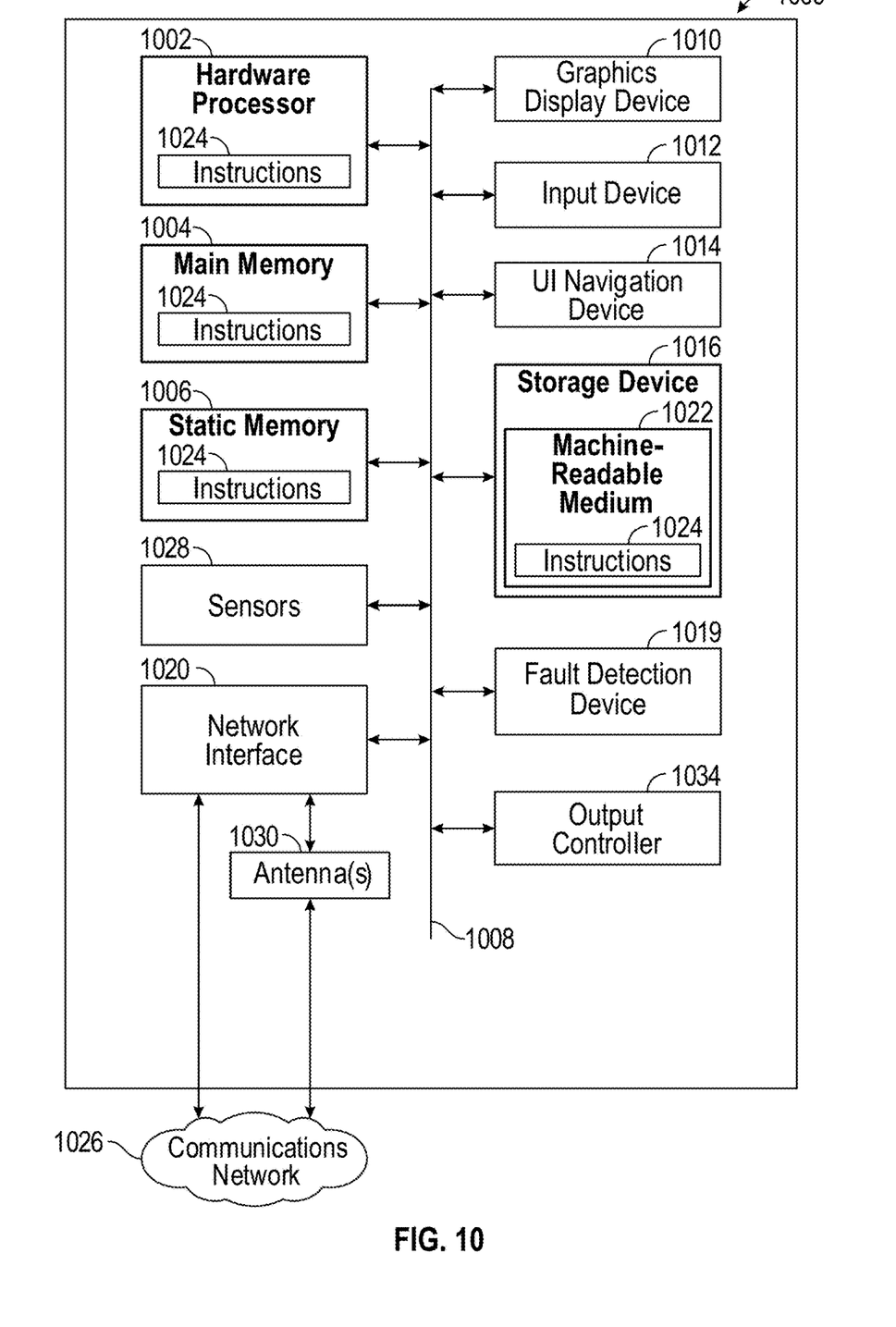
FIG. 10 is a block diagram of an example of a machine or system for high impedance detection, in accordance with one or more example embodiments of the disclosure.

FIG. 10 is a block diagram of an example of a machine or system 1000 for falling conductor protection in accordance with one or more example embodiments of the disclosure.

In other embodiments, the machine 1000 may operate as a standalone device or may be connected (e.g., networked) to other machines. In a networked deployment, the machine 1000 may operate in the capacity of a server machine, a client machine, or both in server-client network environments. In an example, the machine 1000 may act as a peer machine in peer-to-peer (P2P) (or other distributed) network environments. The machine 1000 may be a server (e.g., a real-time server), a computer, an automation controller, a network router, a switch or bridge, or any machine capable of executing instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein, such as cloud computing, software as a service (SaaS), or other computer cluster configurations.

Examples, as described herein, may include or may operate on logic or a number of components, modules, or mechanisms. Modules are tangible entities (e.g., hardware) capable of performing specified operations when operating. A module includes hardware. In an example, the hardware may be specifically configured to carry out a specific operation (e.g., hardwired). In another example, the hardware may include configurable execution units (e.g., transistors, circuits, etc.) and a computer-readable medium containing instructions where the instructions configure the execution units to carry out a specific operation when in operation. The configuration may occur under the direction of the execution units or a loading mechanism. Accordingly, the execution units are communicatively coupled to the computer-readable medium when the device is operating. In this example, the execution units may be a member of more than one module. For example, under operation, the execution units may be configured by a first set of instructions to implement a first module at one point in time and reconfigured by a second set of instructions to implement a second module at a second point in time.

The machine (e.g., computer system) 1000 may include a hardware processor 1002 (e.g., a central processing unit (CPU), a graphics processing unit (GPU), a hardware processor core, or any combination thereof), a main memory 1004 and a static memory 1006, some or all of which may communicate with each other via an interlink (e.g., bus) 1008. The machine 1000 may further include a power management device 1032, a graphics display device 1010, an input device 1012 (e.g., a keyboard), and a user interface (UI) navigation device 1014 (e.g., a mouse). In an example, the graphics display device 1010, input device 1012, and UI navigation device 1014 may be a touch screen display. The machine 1000 may additionally include a storage device (i.e., drive unit) 1016, a signal generation device 1018 (e.g., an emitter, a speaker), a fault detection device ice 1019, a network interface device/transceiver 1020 coupled to antenna(s) 1030, and one or more sensors 1028, such as a global positioning system (GPS) sensor, a compass, an accelerometer, or other sensor. The machine 1000 may include an output controller 1034, such as a serial (e.g., universal serial bus (USB), parallel, or other wired or wireless (e.g., infrared (IR), near field communication (NFC), etc.) connection to communicate with or control one or more peripheral devices (e.g., a printer, a card reader, etc.)).

The storage device 1016 may include a machine readable medium 1022 on which is stored one or more sets of data structures or instructions 1024 (e.g., software) embodying or utilized by any one or more of the techniques or functions described herein. The instructions 1024 may also reside, completely or at least partially, within the main memory 1004, within the static memory 1006, or within the hardware processor 1002 during execution thereof by the machine 1000. In an example, one or any combination of the hardware processor 1002, the main memory 1004, the static memory 1006, or the storage device 1016 may constitute machine-readable media.

The fault detection device 1019 may carry out or perform any of the operations and processes (e.g., the flow diagrams described with respect to FIGS. 2-3 and 5-10) described above.

While the machine-readable medium 1022 is illustrated as a single medium, the term "machine-readable medium" may include a single medium or multiple media (e.g., a centralized or distributed database, and/or associated caches and servers) configured to store the one or more instructions 1024.

Various embodiments may be implemented fully or partially in software and/or firmware. This software and/or firmware may take the form of instructions contained in or on a non-transitory computer-readable storage medium. Those instructions may then be read and executed by one or more processors to enable performance of the operations described herein. The instructions may be in any suitable form, such as but not limited to source code, compiled code, interpreted code, executable code, static code, dynamic code, and the like. Such a computer-readable medium may include any tangible non-transitory medium for storing information in a form readable by one or more computers, such as but not limited to read only memory (ROM); random access memory (RAM); magnetic disk storage media; optical storage media; a flash memory, etc.

The term "machine-readable medium" may include any medium that is capable of storing, encoding, or carrying instructions for execution by the machine 1000 and that cause the machine 1000 to perform any one or more of the techniques of the present disclosure, or that is capable of storing, encoding, or carrying data structures used by or associated with such instructions. Non-limiting machine-readable medium examples may include solid-state memories and optical and magnetic media. In an example, a massed machine-readable medium includes a machine-readable medium with a plurality of particles having resting mass. Specific examples of massed machine-readable media may include non-volatile memory, such as semiconductor memory devices (e.g., electrically programmable read-only memory (EPROM), or electrically erasable programmable read-only memory (EEPROM)) and flash memory devices; magnetic disks, such as internal hard disks and removable disks; magneto-optical disks; and CD-ROM and DVD-ROM disks.

The instructions 1024 may further be transmitted or received over a communications network 1026 using a transmission medium via the network interface device/transceiver 1020 utilizing any one of a number of transfer protocols (e.g., frame relay, internet protocol (IP), transmission control protocol (TCP), user datagram protocol (UDP), hypertext transfer protocol (HTTP), etc.). Example communications networks may include a local area network (LAN), a wide area network (WAN), a packet data network (e.g., the Internet), mobile telephone networks (e.g., cellular networks), plain old telephone (POTS) networks, wireless data networks (e.g., Institute of Electrical and Electronics Engineers (IEEE) 802.11 family of standards known as Wi-Fi®, IEEE 802.16 family of standards known as WiMax®), IEEE 802.15.4 family of standards, and peer-to-peer (P2P) networks, among others. In an example, the network interface device/transceiver 1020 may include one or more physical jacks (e.g., Ethernet, coaxial, or phone jacks) or one or more antennas to connect to the communications network 1026. In an example, the network interface device/transceiver 1020 may include a plurality of antennas to wirelessly communicate using at least one of single-input multiple-output (SIMO), multiple-input multiple-output (MIMO), or multiple-input single-output (MISO) techniques. The term "transmission medium" shall be taken to include any intangible medium that is capable of storing, encoding, or carrying instructions for execution by the machine 1000 and includes digital or analog communications signals or other intangible media to facilitate communication of such software.

The operations and processes described and shown above may be carried out or performed in any suitable order as desired in various implementations. Additionally, in certain implementations, at least a portion of the operations may be carried out in parallel. Furthermore, in certain implementations, less than or more than the operations described may be performed.

The word "exemplary" is used herein to mean "serving as an example, instance, or illustration." Any embodiment described herein as "exemplary" is not necessarily to be construed as preferred or advantageous over other embodiments. The terms "monitoring and computing device," "user device," "communication station," "station," "handheld device," "mobile device," "wireless device" and "user equipment" (UE) as used herein refers to a wireless communication device such as a cellular telephone, a smartphone, a tablet, a netbook, a wireless terminal, a laptop computer, a femtocell, a high data rate (HDR) subscriber station, an access point, a printer, a point of sale device, an access terminal, or other personal communication system (PCS) device. The device may be either mobile or stationary.

As used within this document, the term "communicate" is intended to include transmitting, or receiving, or both transmitting and receiving. This may be particularly useful in claims when describing the organization of data that is being transmitted by one device and received by another, but only the functionality of one of those devices is required to infringe the claim. Similarly, the bidirectional exchange of data between two devices (both devices transmit and receive during the exchange) may be described as "communicating," when only the functionality of one of those devices is being claimed. The term "communicating" as used herein with respect to a wireless communication signal includes transmitting the wireless communication signal and/or receiving the wireless communication signal. For example, a wireless communication unit, which is capable of communicating a wireless communication signal, may include a wireless transmitter to transmit the wireless communication signal to at least one other wireless communication unit, and/or a wireless communication receiver to receive the wireless communication signal from at least one other wireless communication unit.

As used herein, unless otherwise specified, the use of the ordinal adjectives "first," "second," "third," etc., to describe a common object, merely indicates that different instances of like objects are being referred to and are not intended to imply that the objects so described must be in a given sequence, either temporally, spatially, in ranking, or in any other manner.

Some embodiments may be used in conjunction with various devices and systems, for example, a personal computer (PC), a desktop computer, a mobile computer, a laptop computer, a notebook computer, a tablet computer, a server computer, a handheld computer, a handheld device, a personal digital assistant (PDA) device, a handheld PDA device, an on-board device, an off-board device, a hybrid device, a vehicular device, a non-vehicular device, a mobile or portable device, a consumer device, a non-mobile or non-portable device, a wireless communication station, a wireless communication device, a wireless access point (AP), a wired or wireless router, a wired or wireless modem, a video device, an audio device, an audio-video (A/V) device, a wired or wireless network, a wireless area network, a wireless video area network (WVAN), a local area network (LAN), a wireless LAN (WLAN), a personal area network (PAN), a wireless PAN (WPAN), and the like.

It is understood that the above descriptions are for purposes of illustration and are not meant to be limiting.

Although specific embodiments of the disclosure have been described, numerous other modifications and alternative embodiments are within the scope of the disclosure. For example, any of the functionality described with respect to a particular device or component may be performed by another device or component. Further, while specific device characteristics have been described, embodiments of the disclosure may relate to numerous other device characteristics. Further, although embodiments have been described in language specific to structural features and/or methodological acts, it is to be understood that the disclosure is not necessarily limited to the specific features or acts described. Rather, the specific features and acts are disclosed as illustrative forms of implementing the embodiments. Conditional language, such as, among others, "can," "could," "might," or "may," unless specifically stated otherwise, or otherwise understood within the context as used, is generally intended to convey that certain embodiments could include, while other embodiments may not include, certain features, elements, and/or operations. Thus, such conditional language is not generally intended to imply that features, elements, and/or operations are in any way required for one or more embodiments.

A software component may be coded in any of a variety of programming languages. An illustrative programming language may be a lower-level programming language such as an assembly language associated with a particular hardware architecture and/or operating system platform. A software component comprising assembly language instructions may require conversion into executable machine code by an assembler prior to execution by the hardware architecture and/or platform.

Another example programming language may be a higher-level programming language that may be portable across multiple architectures. A software component comprising higher-level programming language instructions may require conversion to an intermediate representation by an interpreter or a compiler prior to execution.

Other examples of programming languages include, but are not limited to, a macro language, a shell or command language, a job control language, a script language, a database task or search language, or a report writing language. In one or more example embodiments, a software component comprising instructions in one of the foregoing examples of programming languages may be executed directly by an operating system or other software component without having to be first transformed into another form.

A software component may be stored as a file or other data storage construct. Software components of a similar type or functionally related may be stored together such as, for example, in a particular directory, folder, or library. Software components may be static (e.g., pre-established or fixed) or dynamic (e.g., created or modified at the time of execution).

Software components may invoke or be invoked by other software components through any of a wide variety of mechanisms. Invoked or invoking software components may comprise other custom-developed application software, operating system functionality (e.g., device drivers, data storage (e.g., file management) routines, other common routines and services, etc.), or third-party software components (e.g., middleware, encryption, or other security software, database management software, file transfer or other network communication software, mathematical or statistical software, image processing software, and format translation software).

Software components associated with a particular solution or system may reside and be executed on a single platform or may be distributed across multiple platforms. The multiple platforms may be associated with more than one hardware vendor, underlying chip technology, or operating system. Furthermore, software components associated with a particular solution or system may be initially written in one or more programming languages, but may invoke software components written in another programming language.

Computer-executable program instructions may be loaded onto a special-purpose computer or other particular machine, a processor, or other programmable data processing apparatus to produce a particular machine, such that execution of the instructions on the computer, processor, or other programmable data processing apparatus causes one or more functions or operations specified in the flow diagrams to be performed. These computer program instructions may also be stored in a computer-readable storage medium (CRSM) that upon execution may direct a computer or other programmable data processing apparatus to function in a particular manner, such that the instructions stored in the computer-readable storage medium produce an article of manufacture including instruction means that implement one or more functions or operations specified in the flow diagrams. The computer program instructions may also be loaded onto a computer or other programmable data processing apparatus to cause a series of operational elements or steps to be performed on the computer or other programmable apparatus to produce a computer-implemented process.

Additional types of CRSM that may be present in any of the devices described herein may include, but are not limited to, programmable random access memory (PRAM), SRAM, DRAM, RAM, ROM, electrically erasable programmable read-only memory (EEPROM), flash memory or other memory technology, compact disc read-only memory (CD-ROM), digital versatile disc (DVD) or other optical storage, magnetic cassettes, magnetic tape, magnetic disk storage or other magnetic storage devices, or any other medium which can be used to store the information and which can be accessed. Combinations of any of the above are also included within the scope of CRSM. Alternatively, computer-readable communication media (CRCM) may include computer-readable instructions, program modules, or other data transmitted within a data signal, such as a carrier wave, or other transmission. However, as used herein, CRSM does not include CRCM.

That which is claimed is:

1. A method comprising:
   receiving, by a processor, operational data associated with a motor;
   determining, by the processor, using one or more algorithms, and based on the operational data, processed data comprising a first ratio of an instantaneous real power and a reactive power of the motor;
   determining, by the processor, using a frequency domain transform of the processed data, a frequency domain representation of the processed data;
   calculating, by the processor, a fault value of the frequency domain representation, the fault value corresponding to a first type of motor failure;
   determining, by the processor and based on the fault value, a baseline of operation for the motor, wherein the baseline is associated with detecting a future fault in the motor;
   monitoring, by the processor, a second ratio of a first energy around a broken rotor fault frequency to a second energy around the broken rotor fault frequency in the frequency domain;
   monitoring, by the processor, a difference between a first angle of a first vector, resulting from a sum of first frequency components around the broken rotor fault frequency, and a second angle of a second vector, resulting from a second sum of second frequency components around the broken rotor fault frequency;
   determining, by the processor, based on the second ratio and the difference, a deviation from the baseline, wherein the deviation is above a threshold amount; and
   causing to send, by the processor and based on determining the deviation, an alert indicative of a fault in the motor.

2. The method of claim 1, wherein the one or more algorithms compute at least one multi-dimensional feature-set from the operational data and the processed data, wherein the feature-set includes operational features including at least: loading level, supply voltage unbalance, supply frequency and signal powers at one or more frequencies from the processed data, and/or transformed functions of frequency-based features.

3. The method of claim 2, wherein the feature-set further includes a set of physics-based features specific to broken rotor faults, the physics-based features being calculated by:
   estimating a speed of the motor;
   calculating a fault frequency;
   calculating energy in a fault frequency band of the processed data; and
   calculating an angle at fault frequency of the processed data.

4. The method in claim 1, wherein the processed data includes at least one of: the instantaneous real power, the instantaneous reactive power, d-axis and q-axis currents of the motor, real and reactive apparent impedance, amplitude and phase demodulated current signal and/or a square of one or more three-phase supply currents.

5. The method in claim 1, wherein the one or more algorithms are run during a monitoring phase and an alerting phase, wherein during the monitoring phase, a multi-dimensional baseline cluster is formed form by stacking feature-sets, and wherein, in the alerting phase, a test cluster is formed from the feature-sets calculated from the operational data.

6. The method of claim 5, wherein determining the baseline of operation for the motor further comprises:
   extracting random sub-clusters from the multi-dimensional baseline cluster;
   estimating statistical deviation between the multi-dimensional baseline cluster and the sub-clusters;
   determining a mean and a standard deviation of these statistical deviation;
   determining a threshold value based on the mean and the standard deviation; and determining a moving average of one or more fault parameters over a time period.

7. The method of claim 5, wherein the alerting phase further comprises;
determining a history of multi-dimensional feature-sets; and
applying a moving window filter to the history to assemble the test cluster, wherein the moving window filter comprises at least a rectangular window.

8. The method in claim 1 wherein the deviation is calculated using machine learning techniques by estimating an overlap between the baseline and test clusters using divergence methods including at least: KL Divergence, JS Divergence, and statistical distance scores including at least: Mahalanobis Distance and Silhouette Score.

9. The method of claim 1, wherein the one or more algorithms also include at least: calculating an active parks vector and a reactive parks vector.

10. The method of claim 1, wherein determining the first ratio of the instantaneous real power and the reactive power of the motor further comprises:
calculating energy in a frequency band corresponding to a broken rotor fault from the frequency domain transformations, wherein the energy comprises the first energy and the second energy.

11. A system comprising:
a computer processor operable to execute a set of computer-executable instructions; and
memory operable to store the set of computer-executable instructions operable to:
receive operational data associated with a motor;
determine, using one or more algorithms and based on the operational data, processed data comprising a ratio of an instantaneous real power and a reactive power of the motor;
determine, using a frequency domain transform of the processed data, a frequency domain representation of the processed data;
calculate a fault value of the frequency domain representation, the fault value corresponding to a first type of motor failure;
determine, based on the fault value, a baseline of operation for the motor, wherein the baseline is associated with detecting a future fault in the motor;
monitor a second ratio of a first energy around a broken rotor fault frequency to a second energy around the broken rotor fault frequency in the frequency domain;
monitor a difference between a first angle of a first vector, resulting from a sum of first frequency components around the broken rotor fault frequency, and a second angle of a second vector, resulting from a second sum of second frequency components around the broken rotor fault frequency;
determine, based on the second ratio and the difference, a deviation from the baseline, wherein the deviation is above a threshold amount; and
cause to send, based on determining the deviation, an alert indicative of a fault in the motor.

12. The system of claim 11, wherein the one or more algorithms compute at least one multi-dimensional feature-set from the operational data and the processed data, wherein the feature-set includes operational features including at least: loading level, supply voltage unbalance, supply frequency and signal powers at one or more frequencies from the processed data, and/or transformed functions of frequency-based features included in the operational features.

13. The system of claim 12, wherein the feature-set further includes a set of physics-based features specific to broken rotor faults, the physics-based features being calculated by:
estimating a speed of the motor;
calculating a fault frequency;
calculating energy in a fault frequency band of the processed data; and
calculating an angle at fault frequency of the processed data.

14. The system in claim 11, wherein the processed data further comprises at least one of: the instantaneous real power, instantaneous reactive power, d-axis and q-axis currents of the motor, real and reactive apparent impedance, amplitude and phase demodulated current signal and/or a square of one or more three-phase supply currents.

15. The system in claim 11, wherein the one or more algorithms are run during a monitoring phase and an alerting phase, wherein during the monitoring phase, a multi-dimensional baseline cluster is formed form by stacking feature-sets, and wherein, in the alerting phase, a test cluster is formed from the feature-sets calculated from the operational data.

16. The system of claim 15, wherein determining the baseline of operation for the motor further comprises:
extracting random sub-clusters from the multi-dimensional baseline cluster;
estimating statistical deviation between the multi-dimensional baseline cluster and the sub-clusters;
determining a mean and a standard deviation of these statistical deviation;
determining a threshold value based on the mean and the standard deviation; and
determining a moving average of one or more fault parameters over a time period.

17. The system of claim 15, wherein the alerting phase further comprises;
determining a history of multi-dimensional feature-sets; and
applying a moving window filter to the history to assemble the test cluster, wherein the moving window filter comprises at least a rectangular window.

18. The system in claim 11, wherein the deviation is calculated using machine learning techniques by estimating an overlap between the baseline and test clusters using divergence methods including at least: KL Divergence, JS Divergence, and statistical distance scores including at least: Mahalanobis Distance and Silhouette Score.

* * * * *